United States Patent
You

(10) Patent No.: US 9,418,762 B1
(45) Date of Patent: Aug. 16, 2016

(54) SEMICONDUCTOR MEMORY DEVICE

(71) Applicant: SK hynix Inc., Gyeonggi-do (KR)

(72) Inventor: Jung-Taek You, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/798,243

(22) Filed: Jul. 13, 2015

(30) Foreign Application Priority Data

Mar. 2, 2015 (KR) ........................ 10-2015-0029057

(51) Int. Cl.
*G11C 7/00* (2006.01)
*G11C 29/00* (2006.01)

(52) U.S. Cl.
CPC .............. *G11C 29/787* (2013.01); *G11C 29/76* (2013.01); *G11C 29/78* (2013.01)

(58) Field of Classification Search
CPC ....... G11C 29/787; G11C 29/76; G11C 29/78
USPC ............................................. 365/200, 225.7
See application file for complete search history.

(56) References Cited

U.S. PATENT DOCUMENTS

| 8,423,839 | B2 | 4/2013 | Yoel et al. | |
|---|---|---|---|---|
| 9,230,693 | B1* | 1/2016 | Lee | ........................ G11C 29/44 |
| 2013/0077430 | A1* | 3/2013 | Na | ........................ G11C 29/022 |
| | | | | 365/233.11 |
| 2014/0078842 | A1* | 3/2014 | Oh et al. | ............... G11C 29/785 |
| | | | | 365/200 |
| 2015/0098287 | A1* | 4/2015 | Lee | ....................... G11C 29/785 |
| | | | | 365/200 |
| 2016/0042805 | A1* | 2/2016 | Park | ....................... G11C 17/16 |
| | | | | 365/96 |
| 2016/0099079 | A1* | 4/2016 | Park | ....................... G11C 29/78 |
| | | | | 365/96 |

FOREIGN PATENT DOCUMENTS

KR 101097445 12/2011

* cited by examiner

*Primary Examiner* — Toan Le
(74) *Attorney, Agent, or Firm* — IP & T Group LLP

(57) ABSTRACT

A semiconductor memory device may include: a first fuse set unit suitable for storing a first repair address during a first mode; a second fuse set unit suitable for storing an input address during a second mode; and a comparison unit suitable for comparing the input address with the first repair address, wherein the first fuse set unit is reset when the first repair address is the same as the input address.

27 Claims, 5 Drawing Sheets

SEMICONDUCTOR MEMORY DEVICE

CROSS-REFERENCE TO RELATED APPLICATIONS

The present application claims priority of Korean Patent Application No. 10-2015-0029057, filed on Mar. 2, 2015, which is incorporated herein by reference in its entirety.

BACKGROUND

1. Field

This patent document relates to a semiconductor design technology and, more particularly, to a semiconductor memory device which performs a repair operation.

2. Description of the Related Art

A repair operation for a defective cell in a semiconductor memory device may be categorized into those performed in the wafer state and those performed in the packaged state. The latter may be referred to as a post package repair (PPR) operation.

Semiconductor memory devices include fuse circuits capable of programming a repair address of a repair target memory cell that is defective. In the programming of the repair address of the repair target memory cell, the repair target memory cell's information is stored so that a redundancy memory cell may be used instead of the defective repair target memory cell.

Through the repair operation, when access to the repair target memory cell is attempted, the redundancy memory cell is accessed by reference to the programmed repair address.

FIG. 1 is a diagram illustrating fuse sets included in a conventional semiconductor memory device.

Referring to FIG. 1, a fuse circuit of the semiconductor memory device includes a plurality of normal fuse sets 111 to 115 and a PPR fuse set 116. The plurality of normal fuse sets 111 to 115 store the repair address information in the semiconductor memory device while in the wafer state, i.e. during the fabrication of the semiconductor memory device. The PPR fuse set 116 is allocated to store the repair address information in the semiconductor memory device while it is in the packaged state, i.e. after the fabrication of the semiconductor memory device.

The PPR operation is performed in response to an external command instructing the semiconductor memory device to perform a repair operation. The semiconductor memory device enters the PPR mode and performs a PPR operation of storing the repair address information, which is applied by an external source, in the PPR fuse set 116.

The PPR mode may include a soft-post package repair (Soft-PPR; SPPR) mode in which the semiconductor memory device latches the repair address information applied from outside (i.e. from an external device or host) in a register or latch unit. Through the SPPR mode, the time required for the repair operation may be reduced. During the SPPR mode, however, when power supplied to the semiconductor memory device is cutoff, the effects of the repair operation, for example, the repair address, disappears. That is, the repair operation during the SPPR mode temporarily stores the repair address information applied from outside.

FIG. 2 is a diagram illustrating a fuse circuit of a semiconductor memory device.

Referring to FIG. 2, a fuse circuit of the semiconductor memory device includes a normal fuse set 210, a PPR fuse set 220, a first comparison unit 230, and a second comparison unit 240.

FIG. 2 exemplarily shows that the normal fuse set 210 already stores addresses ADDRESS<4> and ADDRESS<6> as the repair address information through the repair operation during the fabrication of the semiconductor memory device.

The first comparison unit 230 compares an input address EX_ADD and the repair address information stored in the normal fuse set 210. The first comparison unit 230 enables a first match signal MATCH_NM when the repair address information, for example ADDRESS<4>, stored in the normal fuse set 210 is the same as the input address EX_ADD. The semiconductor memory device can normally access a redundancy memory cell in response to the first match signal MATCH_NM.

However, when a failure occurs in the redundancy memory cell corresponding to the repair address ADDRESS<4> of the repair target memory cell in the packaged state, a user of the semiconductor memory device may store the address ADDRESS<4> in the PPR fuse set 220 as the repair address through the SPPR mode even though the address ADDRESS<4> is already stored in the normal fuse set 210.

Then, when the semiconductor memory device receives the address ADDRESS<4> as an input address EX_ADD from outside, the first and second comparison units 230 and 240 simultaneously generate first and second match signals MATCH_NM and MATCH_PPR indicating that the address ADDRESS<4> stored in the normal fuse set 210 and the address ADDRESS<4> latched in the PPR fuse set 220 are the same as the input address EX_ADD. As a result, a redundancy memory cell corresponding to the first match signal MATCH_NM and a redundancy memory cell corresponding to the second match signal MATCH_PPR are accessed at the same time.

In short, when the repair address information stored in the PPR fuse set 220 during the SPPR mode coincides with the repair address information stored in the normal fuse set 210 during the fabrication of the semiconductor memory device, the redundancy memory cells corresponding to the same repair address information stored both in the PPR fuse set 220 and the normal fuse set 210 may be accessed at the same time. Then, a read failure may occur during a normal operation.

SUMMARY

Various embodiments are directed to a semiconductor memory device capable of preventing simultaneous access to redundancy memory cells.

In an embodiment, a semiconductor memory device may include: a first fuse set unit suitable for storing a first repair address during a first mode; a second fuse set unit suitable for storing an input address during a second mode; and a comparison unit suitable for comparing the input address with the first repair address, wherein the first fuse set unit is reset when the first repair address is the same as the input address.

The semiconductor memory device may further include an address transmission unit suitable for outputting a first fuse set select signal, which is enabled when the first repair address is the same as the input address during the second mode, and a second fuse set select signal, which is enabled during the second mode, and transferring the input address to one or more of the first and second fuse set units; and a path control unit suitable for controlling the address transmission unit for transmission of the first fuse set select signal, the second fuse set select signal, and the input address.

The first fuse set unit may be reset in response to the enabled first fuse set select signal.

The path control unit may include a first path control section suitable for controlling the address transmission unit to output the enabled first fuse set select signal or transfer the input address to the first fuse set unit in response to the comparison result during the second mode; and a second path control section suitable for controlling the address transmission unit to output the second fuse set select signal and transfer the input address to the second fuse set unit during the second mode.

The address transmission unit may include a select address transmission unit suitable for outputting the first fuse set select signal and second fuse set select signal to the first and second fuse set units, respectively, under the control of the path control unit; and a repair address transmission unit suitable for transferring the input address to one or more of the first and second fuse set units under the control of the path control unit.

The repair address transmission unit may transfer the input address to the second fuse set unit during the second mode.

The select address transmission unit may transmit the first fuse set select signal to the first fuse set unit when the first repair address is the same as the input address, and disables the first fuse set select signal when the first repair address is different from the input address.

The repair address transmission unit may transfer the input address to the first fuse set unit when the first repair address is different from the input address.

The semiconductor memory device may further include a setting signal generation unit suitable for activating the second fuse set based on a bank address included in the input address during the second mode.

The setting signal generation unit may deactivate the second fuse set when a previous bank address inputted during a previous second mode is the same as a current bank address inputted during a current second mode.

The setting signal generation unit may include a storage unit suitable for storing a predetermined level and output the predetermined level when initially driven; an output unit suitable for outputting the fuse set setting signal in response to the signal outputted from the storage unit, a bank address for bank information in the input address, and the SPPR setting signal; and a delay unit suitable for generating an update signal by delaying the fuse set setting signal by a predetermined period, and the storage unit stores the bank address after the update signal is activated.

The first mode may comprise a repair operation mode performed before packaging, and the second mode comprises a repair operation mode performed after packaging.

In an embodiment, a semiconductor memory device may include: a first fuse set unit suitable for storing a first repair address during a first mode; a second fuse set unit suitable for storing an second repair address during a second mode; and a comparison unit suitable for receiving an active command and an input address from outside when the semiconductor memory device enters the second mode, and comparing the first repair address and the input address, wherein the first fuse set unit comprises a reset unit for resetting the first fuse set unit when the first repair address is the same as the input address.

The second fuse set unit may store the input address as the second repair address according to a fuse set setting signal which is enabled in response to a write command after the active command is applied.

The semiconductor memory device may further include an address transmission unit suitable for outputting a first fuse set select signal, which is enabled when the first repair address is the same as the input address during the second mode, and a second fuse set select signal, which is enabled during the second mode, and transferring the input address to one or more of the first and second fuse set units; and a path control unit suitable for controlling the address transmission unit for transmission of the first fuse set select signal, the second fuse set select signal, and the input address.

The reset unit may be driven in response to the first fuse set select signal having a predetermined level.

The path control unit may include a first path control section suitable for controlling the address transmission unit to output the enabled first fuse set select signal or transfer the input address to the first fuse set unit in response to the comparison result in response to the active command; and a second path control section suitable for controlling the address transmission unit to output the second fuse set select signal and transfer the input address to the second fuse set unit during the second mode.

The address transmission unit may include a select address transmission unit suitable for outputting the first fuse set select signal and second fuse set select signal to the first and second fuse set units, respectively, under the control of the path control unit; and a repair address transmission unit suitable for transferring the input address to one or more of the first and second fuse set units under the control of the path control unit.

The repair address transmission unit may transfer the input address to the second fuse set unit during the second mode.

The first mode may comprise a repair operation mode performed before packaging, and the second mode comprises a repair operation mode performed after packaging.

In an embodiment, there is provided an operating method of a semiconductor memory device may include a first fuse set unit suitable for storing a first repair address during a first mode and a second fuse set unit suitable for storing an input address during a second mode, the operating method may include: comparing the input address with the first repair address; and resetting the first fuse set unit when the first repair address is the same as the input address.

The operating method may further include: outputting a first fuse set select signal, which is enabled when the first repair address is the same as the input address during the second mode, and a second fuse set select signal, which is enabled during the second mode; transferring the input address to one or more of the first and second fuse set units; and controlling transmission of the first fuse set select signal, the second fuse set select signal, and the input address.

The first fuse set unit may be reset in response to the enabled first fuse set select signal.

The controlling of transmission may include: outputting the enabled first fuse set select signal or transferring the input address to the first fuse set unit in response to a result of the comparing during the second mode; and outputting the second fuse set select signal and transferring the input address to the second fuse set unit during the second mode.

The operating method may further include transferring the input address to the first fuse set unit when the first repair address is different from the input address.

The operating method may further include activating the second fuse set based on a bank address included in the input address during the second mode.

The activating may deactivate the second fuse set when a previous bank address inputted during a previous second mode is the same as a current bank address inputted during a current second mode.

DETAILED DESCRIPTION

Figure 1:
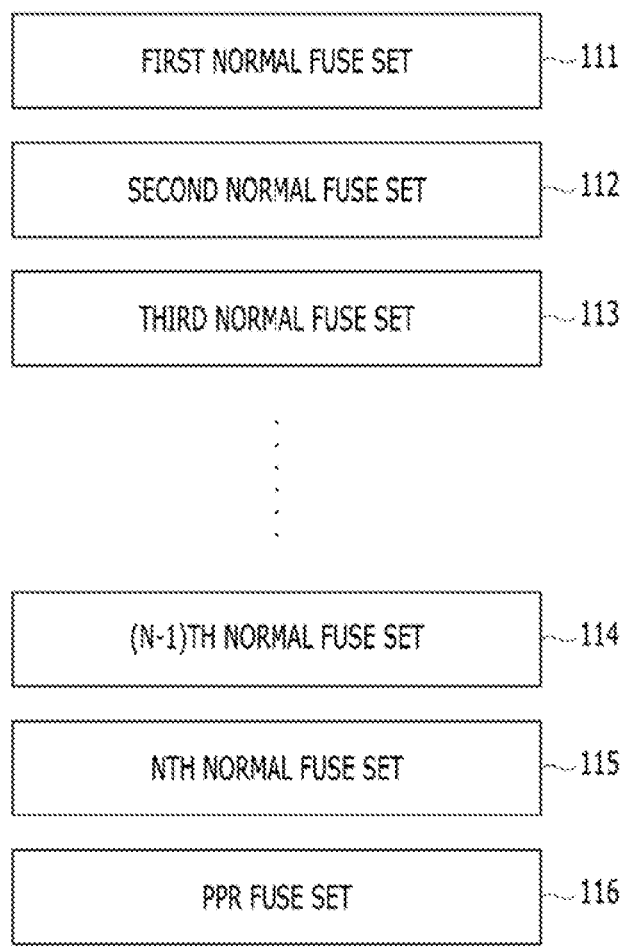
FIG. 1 is a diagram illustrating fuse sets included in a conventional semiconductor memory device.
Figure 2:
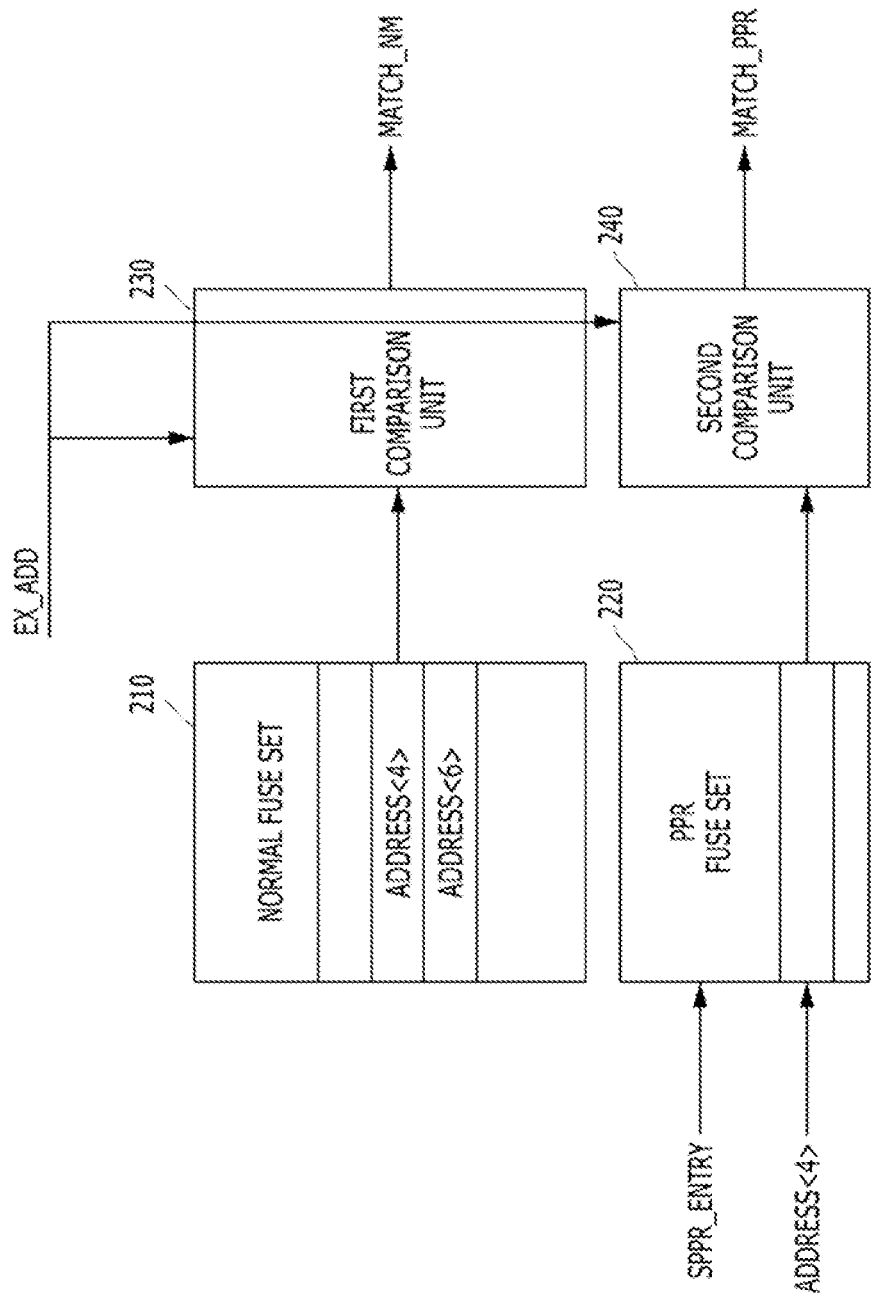
FIG. 2 is a diagram illustrating a fuse circuit of a semiconductor memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
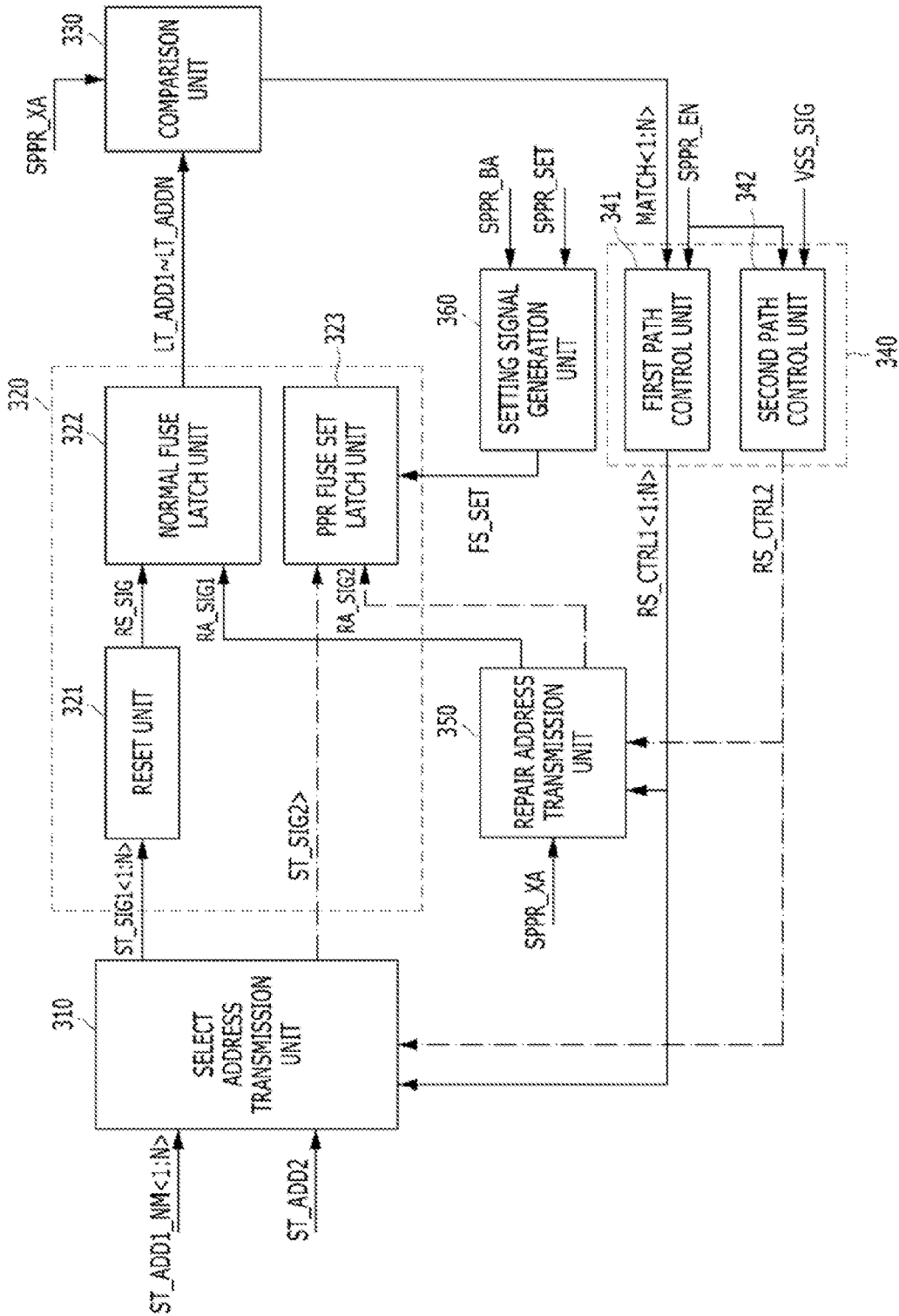
FIG. 3 is a block diagram illustrating a semiconductor memory device in accordance with an embodiment of the present invention.

FIG. 3 is a block diagram illustrating a semiconductor memory device in accordance with an embodiment of the present invention.

Referring to FIG. 3, the semiconductor memory device may include a select address transmission unit 310, a fuse set unit 320, a comparison unit 330, a path control unit 340, a repair address transmission unit 350, and a setting signal generation unit 360. The fuse set unit 320 may include a reset unit 321, a normal fuse set latch unit 322, and a PPR fuse set latch unit 323.

In response to a soft-post package repair (SPPR) command provided from outside, the semiconductor memory device may enter an SPPR mode through an internal mode register set (MRS). During the SPPR mode, an SPPR enable signal SPPR_EN may be high-enabled. Then, when an active command is applied to the semiconductor memory device, an external repair address SRRP_XA of a repair target memory cell may be applied to the comparison unit 330 and the repair address transmission unit 350 from a memory controller (not illustrated). The external repair address SRRP_XA may be a row address of the repair target memory cell.

The comparison unit 330 may compare the external repair address SPPR_XA with normal latch addresses LT_ADD1 to LT_ADDN outputted from the normal fuse set latch unit 332, and output a match signal MATCH<1:N> according to the comparison result to the first path control unit 341. The normal latch addresses LT_ADD1 to LT_ADDN may be the repair address stored during the fabrication of the semiconductor memory device.

The path control unit 340 may include a first path control unit 341 and a second path control unit 342.

The first path control unit 341 may receive the SPPR enable signal SPPR_EN and the match signal MATCH<1:N> from the comparison unit 330. When the SPPR enable signal SPPR_EN is high-enabled, the first path control unit 341 may generate a first control signal RS_CTRL1<1:N> in response to the match signal MATCH<1:N>.

The second path control unit 342 may receive the SPPR enable signal SPPR_EN and a ground voltage level signal VSS_SIG. The second path control unit 342 may generate a second control signal RS_CTRL2, which is fixed to a high level, according to the ground voltage level signal VSS_SIG, regardless of whether the SPPR enable signal SPPR_EN is enabled.

When the normal latch addresses LT_ADD1 to LT_ADDN outputted from the normal fuse set latch unit 322 coincide with the external repair address SPPR_XA, the comparison unit 330 may high-enable the match signal MATCH<1:N> and the first path control unit 341 may high-enable the first control signal RS_CTRL1<1:N> according to the high-enabled match signal MATCH<1:N>.

The select address transmission unit 310 may generate a first select signal ST_SIG1<1:N> fixed to a high level in response to the high-enabled first control signal RS_CTRL1<1:N>.

When the normal latch addresses LT_ADD1 to LT_ADDN outputted from the normal fuse set latch unit 322 coincide with the external repair address SPPR_XA and thus the first select signal ST_SIG1<1:N> is fixed to the high level, the normal latch address information stored in the normal fuse set latch unit 322 may be reset.

In short, during the SPPR mode in which the SPPR enable signal SPPR_EN is high-enabled, the normal fuse set latch unit 322 may be reset before application of a write command when the normal latch addresses LT_ADD1 to LT_ADDN stored in the normal fuse set latch unit 322 at the fabrication step of the semiconductor memory device coincide with the external repair address SPPR_XA.

When the write command is applied in the SPPR mode, the semiconductor memory device may store the external repair address SPPR_XA in the PPR fuse set latch unit 323.

A normal latch address select signal ST_ADD1_NM<1:N> inputted to the select address transmission unit 310 may be low-disabled during the SPPR mode in which the SPPR enable signal SPPR_EN is high-enabled.

During the SPPR mode, a SPPR latch address select signal ST_ADD2 inputted to the select address transmission unit 310 may be low-disabled before input of the write command, and may be high-enabled in response to the write command to activate the PPR fuse set latch unit 323.

The setting signal generation unit 360 may receive a SPPR setting signal SPPR_SET and the external repair bank address SPPR_BA among the repair addresses applied from the memory controller. The SPPR setting signal SPPR_SET may be enabled in response to the write command. The SPPR setting signal SPPR_SET may be enabled to store the external repair address SPPR_XA in the PPR fuse set latch unit 323. The SPPR setting signal SPPR_SET may be enabled when one among a plurality of memory chips is selected according to the write command in the semiconductor memory device of the package state. The setting signal generation unit 360 may enable a fuse set setting signal FS_SET in response to the SPPR setting signal SPPR_SET. Furthermore, the setting signal generation unit 360 may store the external repair bank address SPPR_BA. During the next SPPR mode after the current SPPR mode, the setting signal generation unit 360 may disable the fuse set setting signal FS_SET when the setting signal generation unit 360 receives the same external repair bank address SPPR_BA as stored. This process will be described in detail with reference to FIG. 5.

The PPR fuse set latch unit 323 may be activated in response to the high-enabled SPPR latch address select signal ST_ADD2, and may store the external repair address SPPR_XA in the PPR fuse set latch unit 323 in response to the high-enabled SPPR setting signal SPPR_SET. Then, the semiconductor memory device may exit from the SPPR mode through the MRS.

Meanwhile, during the SPPR mode, the select address transmission unit 310 may receive the SPPR latch address select signal ST_ADD2 and generate a second select signal ST_SIG2. As described above, during the SPPR mode, the SPPR latch address select signal ST_ADD2 may be low-disabled before input of the write command, and may be high-enabled in response to the write command to activate the PPR fuse set latch unit 323 while the normal latch address select signal ST_ADD1_NM<1:N> may be low-disabled during the SPPR mode.

Furthermore, the select address transmission unit 310 may receive first and second control signals RS_CTRL1<1:N> and RS_CTRL2 from the path control unit 340. The select address transmission unit 310 may transmit the normal latch address select signal ST_ADD1_NM<1:M> and the SPPR latch address select signal ST_ADD2 as the first and second select signals ST_SIG1<1:N> and ST_SIG2 to the fuse set unit 320 in response to the first and second control signals RS_CTRL1<1:N> and RS_CTRL2, respectively.

For example, the select address transmission unit 310 may generate the first select signal ST_SIG1<1:N> fixed to a high level in response to the high-enabled first control signal RS_CTRL1<1:N>. On the other hand, the select address transmission unit 310 may transmit the normal latch address select signal ST_ADD1_NM<1:M> as the first select signals ST_SIG1<1:N>, which is low-disabled during the SPPR mode, in response to the low-disabled first control signal RS_CTRL1<1:N>.

In short, during the SPPR mode, the select address transmission unit 310 may reset the normal fuse set latch unit 322 through the first select signal ST_SIG1<1:N> fixed to a high level when the normal latch addresses LT_ADD1 to LT_ADDN outputted from the normal fuse set latch unit 322 coincide with the external repair address SPPR_XA, and may keep the storage status of the normal fuse set latch unit 322 when the normal latch addresses LT_ADD1 to LT_ADDN outputted from the normal fuse set latch unit 322 does not coincide with the external repair address SPPR_XA.

Also, the select address transmission unit 310 may transmit the SPPR latch address select signal ST_ADD2 as the second select signal ST_SIG2 in response to the high-enabled second control signal RS_CTRL2.

In short, the select address transmission unit 310 may transmit the SPPR latch address select signal ST_ADD2 as the second select signal ST_SIG2 in response to the write command during the SPPR mode since the second control signal RS_CTRL2 is fixed to a high level during the SPPR mode and the SPPR latch address select signal ST_ADD2 is high-enabled in response to the write command during the SPPR mode.

The repair address transmission unit 350 may transmit the external repair address SPPR_XA as a first repair information signal RS_SIG1 to the normal fuse set latch unit 322 in response to the first control signal RS_CTRL1<1:N>. The repair address transmission unit 350 may transmit the external repair address SPPR_XA as a second repair information signal RS_SIG2 to the PPR fuse set latch unit 323 in response to the second control signal RS_CTRL2.

For example, when the first control signal RS_CTRL1<1:N> is high-enabled, the repair address transmission unit 350 may output the first repair information signal RA_SIG1 having a predetermined level, regardless of the external repair address SPPR_XA. The transmission path of the external repair address SPPR_XA may be blocked in response to the high-enabled first control signal RS_CTRL1<1:N>. Furthermore, when the first control signal RS_CTRL1<1:N> is low-disabled, the repair address transmission unit 350 may output the external repair address SPPR_XA as the first repair information signal RA_SIG1.

As the second control signal RS_CTRL2 is fixed to a high level by the second path control unit 342 in response to the ground voltage level signal VSS_SIG, the repair address transmission unit 350 may output the external repair address SPPR_XA as the second repair information signal RA_SIG2.

The reset unit 321 may receive the first select signal ST_SIG1<1:N> outputted from the select address transmission unit 310. The reset unit 321 may reset the normal fuse latch unit 322 through a reset operation signal RS_SIG in response to the first select signal ST_SIG1<1:N> having a high level during the SPPR mode.

The normal fuse set latch unit 322 may store fail addresses as the normal latch addresses LT_ADD1 to LT_ADDN based on a repair operation performed during the wafer state or the fabrication of the semiconductor memory device.

The normal fuse latch unit 322 may be reset by the reset unit 321 through the reset operation signal RS_SIG in response to the first select signal ST_SIG1<1:N> having a high level during the SPPR mode. The normal fuse set latch unit 322 may reset the normal latch addresses LT_ADD1 to LT_ADDN, which is already stored at the wafer state, in response to the reset operation signal RS_SIG. When the first control signal RS_CTRL1<1:N> is high-enabled, the input of the external repair address SPPR_XA as the first repair information signal RA_SIG1 from the repair address transmission unit 350 to the normal fuse latch unit 322 may be blocked in response to the high-enabled first control signal RS_CTRL1<1:N>. When the first control signal RS_CTRL1<1:N> is low-disabled, the normal fuse latch unit 322 may store the external repair address SPPR_XA as the first repair information signal RA_SIG1 output from the repair address transmission unit 350.

The PPR fuse set latch unit 323 may receive the high-enabled second select signal ST_SIG2 from the select address transmission unit 310, the second repair information signal RS_SIG2 from the repair address transmission unit 350, and the enabled fuse set setting signal FS_SET from the setting signal generation unit 360 in response to the write command during the SPPR mode. The PPR fuse set latch unit 323 may latch the second repair information signal RS_SIG2 in response to the high-enabled second select signal ST_SIG2 and the enabled fuse set setting signal FS_SET in response to the write command during the SPPR mode.

Now, the operation of the semiconductor memory device will be described as follows.

When the semiconductor memory device enters the SPPR mode, the SPPR enable signal SPPR_EN may be generated. During the SPPR mode, the external repair address SPPR_XA may be applied to the comparison unit 330 and the repair address transmission unit 350 from the memory controller. The comparison unit 330 may compare the external repair address SPPR_XA with the normal latch addresses LT_ADD1 to LT_ADDN outputted from the normal fuse set latch unit 322.

The operation will be described for when the external repair address SPPR_XA and the normal latch addresses LT_ADD1 to LT_ADDN are the same as each other.

The comparison unit 330 may high-enable the match signal MATCH<1:N>. The first path control unit 341 may high-enable the first control signal RS_CTRL1<1:N> in response to the high-enabled SPPR enable signal SPPR_EN and the high-enabled match signal MATCH<1:N>. The select address transmission unit 310 may high-enable the first select signal ST_SIG1<1:N>. The reset unit 321 may reset the normal fuse set latch unit 322 through the reset operation signal RS_SIG in response to the high-enabled first select signal ST_SIG1<1:N>. The normal fuse set latch unit 322 may perform a reset operation in response to the reset operation signal RS_SIG.

The repair address transmission unit 350 may block the transmission path of the external repair address SPPR_XA to the normal fuse latch unit 322 in response to the high-enabled first control signal RS_CTRL1<1:N>.

The second path control unit 342 may generate the second control signal RS_CTRL2 fixed to a high level in response to the ground voltage level signal VSS_SIG. The select address transmission unit 310 may output the second select signal ST_SIG2 corresponding to the SPPR latch address select signal ST_ADD2 in response to the second control signal RS_CTRL2 having a high level. That is, since the write command is not yet applied in the SPPR mode, the select address transmission unit 310 may low-disable the second select signal ST_SIG2 according to the low-disabled SPPR latch address select signal ST_ADD2. The repair address transmission unit 350 may transmit the external repair address SPPR_XA to the PPR fuse set latch unit 323 as the second repair information signal RA_SIG2 in response to the high-enabled second control signal RS_CTRL2.

Then, when the write command is applied, the setting signal generation unit 360 may high-enable the fuse set setting signal FS_SET in response to the SPPR setting signal SPPR_SET, which is high-enabled in response to the write command during the SPPR mode. Furthermore, the select address transmission unit 310 may receive the SPPR latch address select signal ST_ADD2, which is high-enabled in response to the write command during the SPPR mode. The select address transmission unit 310 may high-enable the second select signal ST_SIG2 in response to the high-enabled SPPR latch address select signal ST_ADD2. The PPR fuse set latch unit 323 may be activated in response to the high-enabled second select signal ST_SIG2. Furthermore, the PPR fuse set latch unit 323 may latch the second repair information signal RA_SIG2 received from the repair address transmission unit 350 in response to the high-enabled fuse set setting signal FS_SET.

In summary, when the write command is applied during the SPPR mode and the external repair address SPPR_XA is the same as the normal latch addresses LT_ADD1 to LT_ADDN, the PPR fuse set latch unit 323 may store the external repair address SPPR_XA while the normal fuse latch unit 322 may be reset.

The operation will be described for when the external repair address SPPR_XA and the normal latch addresses LT_ADD1 to LT_ADDN are not the same as each other. In the SPPR mode, the normal latch address select signal ST_ADD1_NM<1:N> may be low-disabled at all times.

The comparison unit 330 may low-disable the match signal MATCH<1:N>. The first path control unit 341 may low-disable the first control signal RS_CTRL1<1:N> in response to the high-enabled SPPR enable signal SPPR_EN and the low-disabled match signal MATCH<1:N>. The select address transmission unit 310 may low-disable the first select signal ST_SIG1<1:N> corresponding to the low-disabled normal latch address select signal ST_ADD1_NM<1:N> in response to the low-disabled first control signal RS_CTRL1<1:N>. The reset unit 321 may be deactivated in response to the low-disabled first select signal ST_SIG1<1:N>. The repair address transmission unit 350 may transmit the external repair address SPPR_XA to the normal fuse set latch unit 322 as the first repair information signal RA_SIG1 in response to the low-disabled first control signal RS_CTRL1<1:N>.

The second path control unit 342 may generate the high-enabled second control signal RS_CTRL2 in response to the ground voltage level signal VSS_SIG, regardless of whether the SPPR enable signal SPPR_EN is high-enabled. The select address transmission unit 310 may low-disable the second select signal ST_SIG2 corresponding to the low-disabled SPPR latch address select signal ST_ADD2 in response to the high-enabled second control signal RS_CTRL2. The select address transmission unit 310 may low-disable the second select signal ST_SIG2 because the write command is not yet applied to the semiconductor memory device. The repair address transmission unit 350 may transmit the external repair address SPPR_XA to the PPR fuse set latch unit 323 as the second repair information signal RA_SIG2 in response to the high-enabled second control signal RS_CTRL2.

Then, when the write command is applied, the setting signal generation unit 360 may high-enable the fuse set setting signal FS_SET in response to the SPPR setting signal SPPR_SET, which is high-enabled in response to the write command during the SPPR mode. Furthermore, the select address transmission unit 310 may receive the SPPR latch address select signal ST_ADD2, which is high-enabled in response to the write command during the SPPR mode. The select address transmission unit 310 may high-enable the second select signal ST_SIG2 in response to the high-enabled SPPR latch address select signal ST_ADD2. The PPR fuse set latch unit 323 may be activated in response to the high-enabled second select signal ST_SIG2, and latch the second repair information signal RA_SIG2 transmitted from the repair address transmission unit 350 in response to the high-enabled fuse set setting signal FS_SET.

In summary, when the write command is applied during the SPPR mode and the external repair address SPPR_XA is different from the normal latch addresses LT_ADD1 to LT_ADDN, both of the normal fuse latch unit 322 and the PPR fuse set latch unit 323 may store the external repair address SPPR_XA.

In accordance with the embodiment of the present invention, the semiconductor memory device may compare the fail address information, which is stored in the normal fuse set latch unit 322 at the fabrication step, with the external repair address SPPR_XA applied from outside during the SPPR mode. When the fail address information is the same as the external repair address SPPR_XA, the semiconductor memory device may reset the fail address information stored in the normal fuse set latch unit 322.

Thus, even when the fail information of the package state is the same as the fail address information of the wafer state, the redundancy memory cell corresponding to the normal fuse set latch unit 322 and the redundancy memory cell corresponding to the PPR fuse set latch unit 323 may not be accessed at the same time. That is, it is possible to prevent an error which may occur as a plurality of redundancy memory cells are accessed during a normal operation of the semiconductor memory device even when the fail information of the package state is the same as the fail address information of the wafer state, thereby increasing the reliability of the semiconductor memory device.

After resetting the fail information of the normal fuse set latch unit 322 during the previous SPPR mode, the semiconductor memory device may block the repair operation in the same bank during the next SPPR mode, thereby preventing an error which may occur during a normal operation of the semiconductor memory device.

Figure 4:
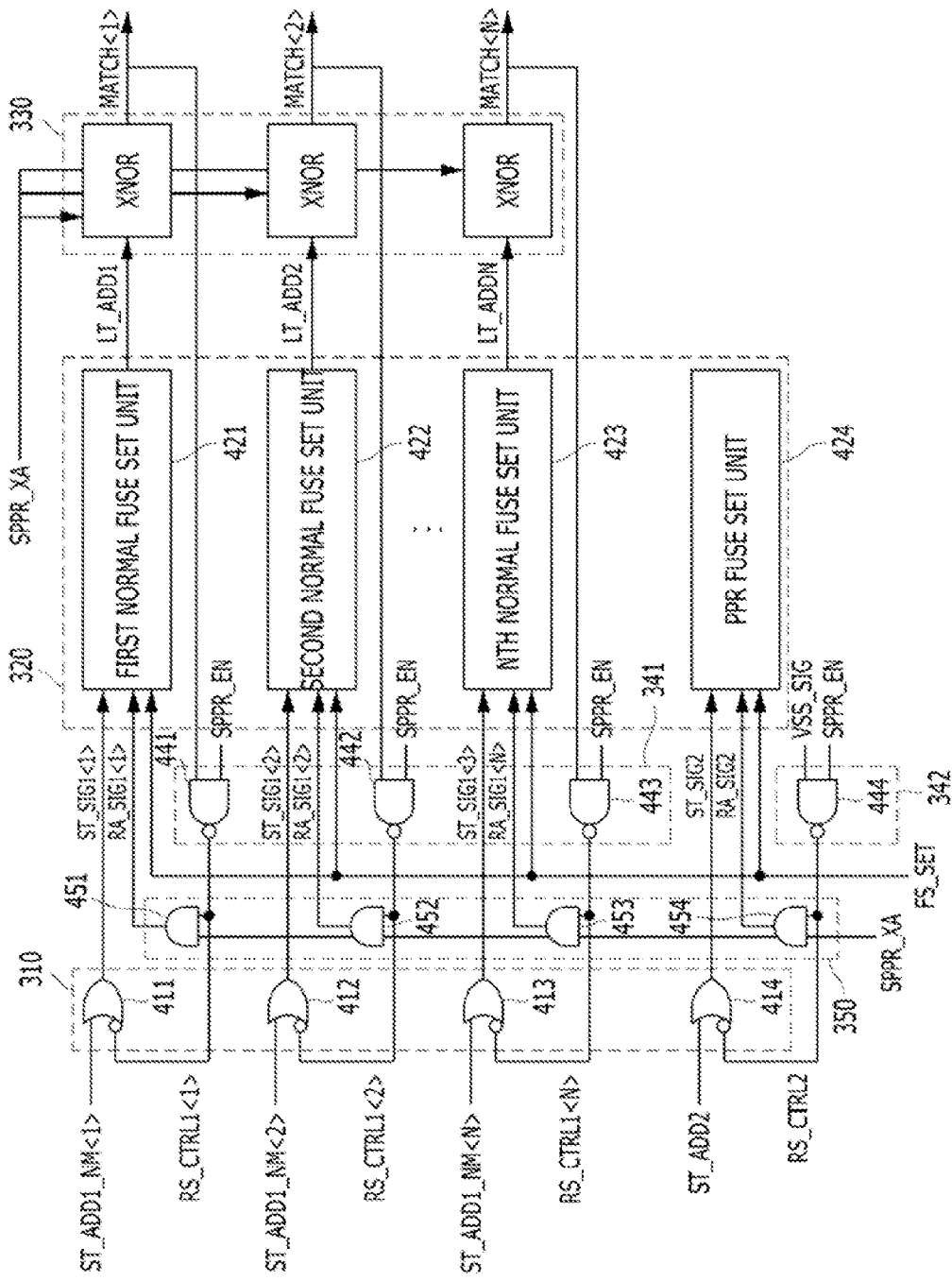
FIG. 4 is a circuit diagram illustrating a part of a semiconductor memory device illustrated in FIG. 3.

FIG. 4 is a detailed circuit diagram of the select address transmission unit 310, the fuse set unit 320, the comparison unit 330, the path control unit 340, and the repair address transmission unit 350, which are illustrated in FIG. 3. The path control unit 340 may include the first path control unit 341 and the second path control unit 342.

Referring to FIG. 4, the select address transmission unit 310 may include OR gates 411 to 414. The OR gates 411 to 413 may receive the normal latch address signal ST_ADD1_NM<1:N> and the first control signal RS_CTRL1<1:N>, which is inverted, and the OR gate 414 may receive the SPPR latch address select signal ST_ADD2 and the inverted second control signal RS_CTRL2, which is inverted.

The fuse set unit 320 may include first to Nth normal fuse set units 421 to 423 and a PPR fuse set unit 434. Although not illustrated, each of the first to Nth normal fuse set units 421 to 423 may include the reset unit 321 and the normal fuse set latch unit 322, and the PPR fuse set unit 424 may include the PPR fuse set latch unit 323.

The comparison unit 330 may include a plurality of XNOR gates XNOR configured to receive the external repair address SPPR_XA and normal latch addresses LT_ADD1 to LT_ADDN outputted from the first to Nth normal fuse set units 421 to 423, respectively, and compare the received addresses. The plurality of XNOR gates XNOR may compare the external repair address SPPR_XA to the normal latch addresses LT_ADD1 to LT_ADDN, and output the match signal MATCH<1:N>.

The first path control unit 341 may include a plurality of NAND gates 441 to 443 to receive the SPPR enable signal SPPR_EN and the match signal MATCH<1:N>, respectively. The plurality of NAND gates 441 to 443 may combine the match signal MATCH<1:N> and the SPPR enable signal SPPR_EN, and output the first control signal RS_CTRL1<1:N>.

The second path control unit 342 may include a NAND gate 444 configured to receive the SPPR enable signal SPPR_EN and the ground voltage level signal VSS_SIG. The NAND gate 444 may output the high-enabled second control signal RS_CTRL2 according to the SPPR enable signal SPPR_EN and the ground voltage level signal VSS_SIG.

The repair address transmission unit 350 may include a plurality of AND gates 451 to 454. The plurality of AND gates 451 to 453 may receive the external repair address SPPR_XA and the first control signal RS_CTRL1<1:N>. The AND gate 454 may receive the external repair address SPPR_XA and the second control signal RS_CTRL2.

The operations of the respective units will be described as follows.

First, suppose that the external repair address SPPR_XA is the same as the second normal latch address LT_ADD2 outputted from the second normal fuse set unit 422 of the fuse set unit 320.

When the semiconductor memory device enters the SPPR mode, the SPPR enable signal SPPR_EN may be high-enabled. Then, as the active command is applied, the external repair address SPPR_XA may be applied to the comparison unit 330. The comparison unit 330 may compare the second normal latch address LT_ADD2 outputted from the second normal fuse set unit 422 to the repair address SPPR_XA.

The comparison unit 330 may high-enable the second match signal MATCH<2> as the comparison result of the XNOR gate XNOR. The second NAND gate 442 of the first path control unit 341 may low-disable the first control signal RS_CTRL1<2> in response to the high-enabled SPPR enable signal SPPR_EN and the high-enabled second match signal MATCH<2>. The NAND gate 444 of the second path control unit 342 may high-enable the second control signal RS_CTRL2 in response to the ground voltage level signal VSS_SIG.

The second OR gate 412 may high-enable the first select signal ST_SIG1<2> in response to the signal of the low-level first control signal RS_CTRL1<2>, which is inverted to a high level, and the low-disabled normal latch address select signal ST_ADD1_NM2. The second normal fuse set unit 422 may reset the fail address information stored therein through the high-enabled first select signal ST_SIG1<2> in response to the high-enabled first select signal ST_SIG1<2>. The second AND gate 452 of the repair address transmission unit 350 may low-disable the first repair information signal RA_SIG1<2> in response to the low-disabled first control signal RS_CTRL1<2>.

Then, when the write command is applied to the semiconductor memory device during the SPPR mode, the fuse set setting signal FS_SET and the SPPR latch address select signal ST_ADD2 corresponding to the PPR fuse set unit 424 may be high-enabled. Furthermore, the normal latch address select signal ST_ADD1_NM<1:N> inputted to the select address transmission unit 310 may be low-disabled during the SPPR mode.

The OR gate 414 of the select address transmission unit 310 may high-enable and output the second select signal ST_SIG2 to the PPR fuse set unit 424 in response to the high-enabled SPPR latch address select signal ST_ADD2 and the high-enabled second control signal RS_CTRL2. Furthermore, the external repair address SPPR_XA may be applied to the AND gate 454 of the repair address transmission unit 350. The AND gate 454 may output the external repair address SPPR_XA as the second repair information signal RA_SIG2 in response to the high-enabled second control signal RS_CTRL2. The PPR fuse set unit 424 may receive the second high-enabled select signal ST_SIG2, the second repair information signal RS_SIG2, and the high-enabled fuse set setting signal FS_SET. The PPR fuse set unit 424 may latch the second repair information signal RS_SIG2, which is the external repair address SPPR_XA, in response to the high-enabled fuse set setting signal FS_SET.

Second, suppose that the external repair address SPPR_XA is not the same as the second normal latch address LT_ADD2 outputted from the second normal fuse set unit 422 of the fuse set unit 320.

When the semiconductor memory device enters the SPPR mode, the SPPR enable signal SPPR_EN may be high-enabled. Then, as the active command is applied, the external repair address SPPR_XA may be applied to the comparison unit 330. The comparison unit 330 may compare the second normal latch address LT_ADD2 outputted from the second normal fuse set unit 422 to the repair address SPPR_XA.

The comparison unit 330 may low-disable the second match signal MATCH<2> as the comparison result of the XNOR gate XNOR. The second NAND gate 442 of the first path control unit 341 may high-enable the first control signal RS_CTRL1<2> in response to the high-enabled SPPR enable signal SPPR_EN and the low-disabled second match signal MATCH<2>. The NAND gate 444 of the second path control unit 342 may high-enable the second control signal RS_CTRL2 in response to the ground voltage level signal VSS_SIG.

The second OR gate 412 may low-disable the first select signal ST_SIG1<2> in response to the first control signal RS_CTRL1<2>, which is inverted to a low level, and the low-disabled normal latch address select signal ST_ADD1_NM2. The low-disabled first select signal ST_SIG1<2> may be transmitted to the second normal fuse set unit 422. The AND gate 452 of the repair address transmission unit 350 may transmit the first repair information signal RA_SIG1<2>, which is the external repair address SPPR_XA, to the second normal fuse set unit 422 in response to the high-enabled first control signal RS_CTRL1<2>.

Then, when the write command is applied to the semiconductor memory device during the SPPR mode, the fuse set setting signal FS_SET and the SPPR latch address select signal ST_ADD2 corresponding to the PPR fuse set unit 424 may be high-enabled. Furthermore, the normal latch address select signal ST_ADD1_NM<1:N> Inputted to the select address transmission unit 310 may be low-disabled during the SPPR mode.

The OR gate 414 of the select address transmission unit 310 may high-enable and output the second select signal ST_SIG2 to the PPR fuse set unit 424 in response to the high-enabled SPPR latch address select signal ST_ADD2 and the high-enabled second control signal RS_CTRL2. Furthermore, the external repair address SPPR_XA may be applied to the AND gate 454 of the repair address transmission unit 350. The AND gate 454 may output the external repair address SPPR_XA as the second repair information signal RA_SIG2 in response to the high-enabled second control signal RS_CTRL2. The PPR fuse set unit 424 may receive the high-enabled second select signal ST_SIG2, the second repair information signal RS_SIG2, and the high-enabled fuse set setting signal FS_SET. The PPR fuse set unit 424 may latch the second repair information signal RS_SIG2, which is the external repair address SPPR_XA, in response to the high-enabled fuse set setting signal FS_SET.

Figure 5:
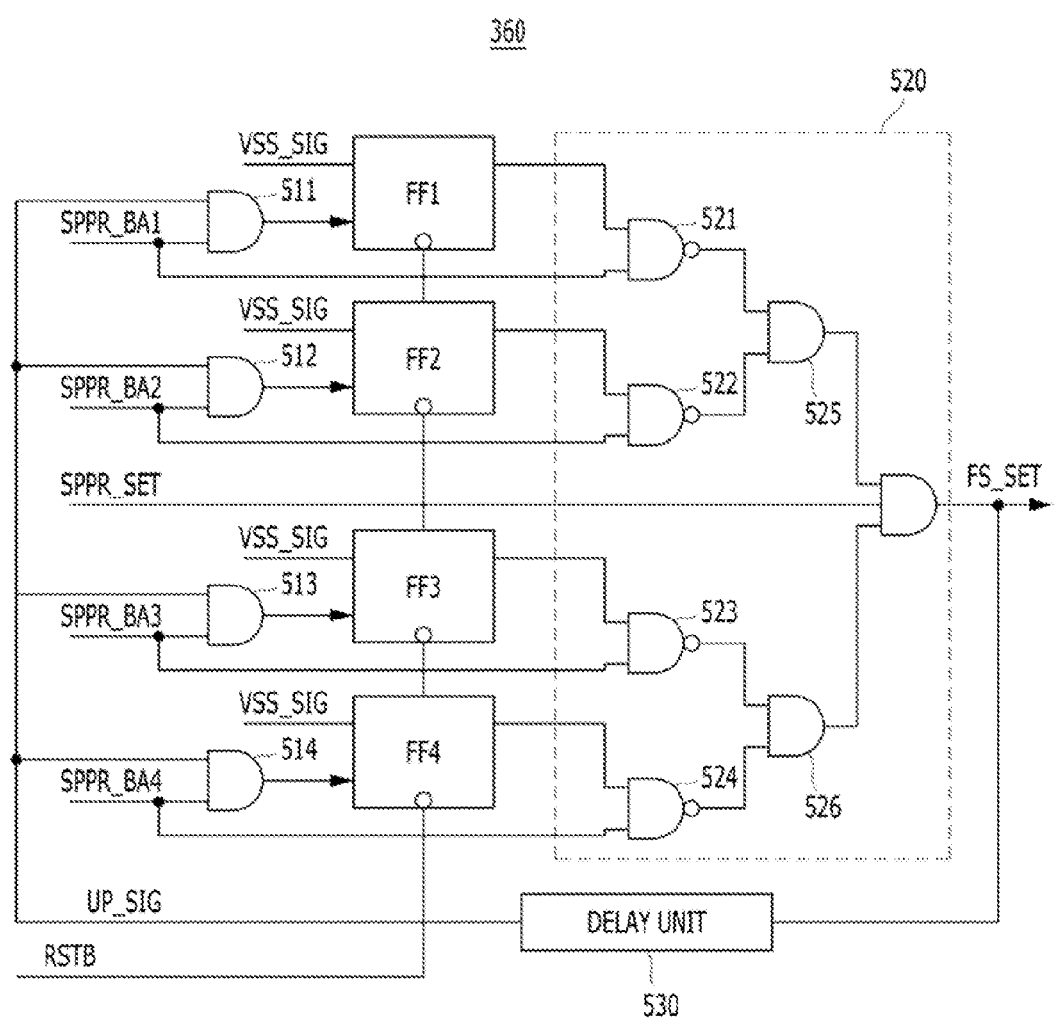
FIG. 5 is a circuit diagram illustrating a setting signal generation unit illustrated in FIG. 3.

FIG. 5 is a circuit diagram illustrating the setting signal generation unit 360 illustrated in FIG. 3.

Referring to FIG. 5, the setting signal generation unit 360 may include first to fourth AND gates 511 to 514, first to fourth flip-flops FF1 to FF4, an output unit 520, and a delay unit 530.

The setting signal generation unit 360 may receive the SPPR setting signal SPPR_SET, which is enabled in response to the write command during the SPPR mode, and first to fourth external repair addresses SPPR_BA1 to SPPR_BA4, which are the external repair bank address SPPR_BA among the repair addresses applied from the memory controller. The first to fourth external repair addresses SPPR_BA1 to SPPR_BA4 may indicate address information of a bank including memory cells corresponding to the external repair address SPPR_XA applied during the SPPR mode.

The first to fourth AND gates 511 to 514 may receive the first to fourth external repair addresses SPPR_BA1 to SPPR_BA4, respectively, and an update signal UP_SIG.

Each of the first to fourth flip-flops FF1 to FF4 may be reset in response to a reset signal RSTB received from a reset terminal. The first to fourth flip-flops FF1 to FF4 may receive the ground voltage level signal VSS_SIG and the signals outputted from the first to fourth AND gates 511 to 514. During an initial operation, the first to fourth flip-flops FF1 to FF4 may receive a low-level signal, regardless of the signals outputted from the first to fourth AND gates 511 to 514. After outputting the low-level signal, the first to fourth flip-flops FF1 to FF4 may store level values corresponding to the signals outputted from the first to fourth AND gates 511 to 514.

The output unit 520 may include four NAND gates 521 to 524 and three AND gates 525 and 527. The NAND gates 521 to 524 may receive the signals outputted from the first to fourth flip-flops FF1 to FF4 and the first to fourth external repair addresses SPPR_BA1 to SPPR_BA4. The signals outputted from the NAND gates 521 to 524 may be inputted to the AND gates 525 and 526. The signals outputted from the AND gates 525 and 526 and the SPPR setting signal SPPR_SET may be inputted to the AND gate 527, and the output unit 520 may output a fuse set setting signal FS_SET according to a combination of the input signals.

The delay unit 530 may receive the fuse set setting signal FS_SET, delay the fuse set setting signal FS_SET signal, and output the update signal UP_SIG.

Next, the operations of the respective units will be described as follows.

During the SPPR mode, an address corresponding to a bank including a fail address among the first to fourth external repair addresses SPPR_BA1 to SPPR_BA4 may be inputted. Then, as the write command is applied, the SPPR setting signal SPPR_SET may be enabled.

During the initial operation, the first to fourth flip-flops FF1 to FF4 may be set in response to the reset signal RSTB. The first to fourth flip-flops FF1 to FF4 may output low-level signals in response to the ground voltage level signal VSS_SIG. The NAND gates 521 to 524 of the output unit 520 may receive the low-level signals from the first to fourth flip-flops FF1 to FF4, and output high-level signals regardless of the first to fourth external repair addresses SPPR_BA1 to SPPR_BA4. The AND gates 525 and 526 may output high-level signals according to the high-level signals outputted from the NAND gates 521 to 524. The AND gate 527 may enable the fuse set setting signal FS_SET according to the enabled SPPR setting signal SPPR_SET and the high-level signals outputted from the AND gates 525 and 526. In response to the enabled fuse set setting signal FS_SET, the external repair address SPPR_XA applied during the SPPR mode may be stored in the PPR fuse set latch unit 323.

Furthermore, the outputted fuse set setting signal FS_SET may be inputted to the delay unit 530. The delay unit 530 may delay the fuse set setting signal FS_SET, and high-enable the update signal UP_SIG.

The AND gates 511 to 514 may perform an AND operation on the high-enabled update signal UP_SIG and the first to fourth external repair addresses SPPR_BA1 to SPPR_BA4, and output the operation results to the first to fourth flip-flops FF1 to FF4, respectively.

For example, each of the AND gates 511 to 514 may output a high-level signal to the corresponding flip-flop among the first to fourth flip-flops FF1 to FF4 in response to an address of the first to fourth external repair addresses SPPR_BA1 to SPPR_BA4 and the high-enabled update signal UP_SIG.

On the other hand, each of the AND gates 511 to 514 may output a low-level signal to the corresponding flip-flop among the first to fourth flip-flops FF1 to FF4 in response to a address of the first to fourth external repair addresses SPPR_BA1 to SPPR_BA4, regardless of the high-enabled update signal UP_SIG. The first to fourth flip-flops FF1 to FF4 may store the high or low-level signals outputted from the AND gates 511 to 514.

Then, when the semiconductor memory device enters the SPPR mode again, the setting signal generation unit 360 may receive the enabled SPPR setting signal SPPR_SET and new first to fourth external repair addresses SPPR_BA1 to SPPR_BA4.

The NAND gates 521 to 524 may receive the new first to fourth external repair addresses SPPR_BA1 to SPPR_BA4 and the first to fourth external repair addresses outputted from the first to fourth flip-flops FF1 to FF4 and corresponding to the previous SPPR mode. The NAND gates 521 to 524 may output low-level signals when the new first to fourth external repair addresses SPPR_BA1 to SPPR_BA4 are the same as the addresses corresponding to the previous SPPR mode.

Thus, the AND gates 525 to 527 may disable the fuse set setting signal FS_SET according to the low-level signals outputted from the NAND gates 512 to 524. That is, when the bank information applied during the previous SPPR mode is the same as bank information applied during the current SPPR mode, the output unit 520 may disable the fuse set setting signal FS_SET even though the SPPR setting signal SPPR_SET is enabled. Thus, the semiconductor memory device cannot perform the SPPR operation of storing the fail address information applied from outside in the PPR fuse set unit.

Thus, when the SPPR mode is executed two or more times in the same bank, the semiconductor memory device may block the repair operation corresponding to the next SPPR mode, thereby preventing an error which may occur during a normal operation of the semiconductor memory device.

The semiconductor memory device can prevent an operation error which may occur when fail address information stored in the normal fuse set is the same as fail address information stored in the PPR fuse set, thereby increasing the reliability of the semiconductor memory device.

Although various embodiments have been described for illustrative purposes, it will be apparent to those skilled in the art that various changes and modifications may be made without departing from the spirit and scope of the invention as defined in the following claims.

For example, the positions and types of the logic gates and transistors used in the above-described embodiments may be set in different manners depending on the polarities of input signals.

What is claimed is:

1. A semiconductor memory device comprising:
   a first fuse set unit suitable for storing a first repair address during a first mode;
   a second fuse set unit suitable for storing an input address during a second mode; and
   a comparison unit suitable for comparing the input address with the first repair address,
   wherein the first fuse set unit is reset when the first repair address is the same as the input address.

2. The semiconductor memory device of claim 1, further comprising:
   an address transmission unit suitable for outputting a first fuse set select signal, which is enabled when the first repair address is the same as the input address during the second mode, and a second fuse set select signal, which is enabled during the second mode, and transferring the input address to one or more of the first and second fuse set units; and
   a path control unit suitable for controlling the address transmission unit for transmission of the first fuse set select signal, the second fuse set select signal, and the input address.

3. The semiconductor memory device of claim 2, wherein the first fuse set unit is reset in response to the enabled first fuse set select signal.

4. The semiconductor memory device of claim 2, wherein the path control unit comprises:
   a first path control section suitable for controlling the address transmission unit to output the enabled first fuse set select signal or transfer the input address to the first fuse set unit in response to the comparison result during the second mode; and
   a second path control section suitable for controlling the address transmission unit to output the second fuse set select signal and transfer the input address to the second fuse set unit during the second mode.

5. The semiconductor memory device of claim 4, wherein the address transmission unit comprises:
   a select address transmission unit suitable for outputting the first fuse set select signal and second fuse set select signal to the first and second fuse set units, respectively, under the control of the path control unit; and
   a repair address transmission unit suitable for transferring the input address to one or more of the first and second fuse set units under the control of the path control unit.

6. The semiconductor memory device of claim 5, wherein the repair address transmission unit transfers the input address to the second fuse set unit during the second mode.

7. The semiconductor memory device of claim 5, wherein the select address transmission unit transmits the first fuse set select signal to the first fuse set unit when the first repair address is the same as the input address, and disables the first fuse set select signal when the first repair address is different from the input address.

8. The semiconductor memory device of claim 5, wherein the repair address transmission unit transfers the input address to the first fuse set unit when the first repair address is different from the input address.

9. The semiconductor memory device of claim 1, further comprising a setting signal generation unit suitable for activating the second fuse set based on a bank address included in the input address during the second mode.

10. The semiconductor memory device of claim 9, wherein the setting signal generation unit deactivates the second fuse set when a previous bank address inputted during a previous second mode is the same as a current bank address inputted during a current second mode.

11. The semiconductor memory device of claim 9, wherein the setting signal generation unit comprises:
    a storage unit suitable for storing a predetermined level and output the predetermined level when initially driven;
    an output unit suitable for outputting the fuse set setting signal in response to the signal outputted from the storage unit, a bank address for bank information in the input address, and the SPPR setting signal; and
    a delay unit suitable for generating an update signal by delaying the fuse set setting signal by a predetermined period, and
    the storage unit stores the bank address after the update signal is activated.

12. The semiconductor memory device of claim 1, wherein the first mode comprises a repair operation mode performed before packaging, and the second mode comprises a repair operation mode performed after packaging.

13. A semiconductor memory device comprising:
    a first fuse set unit suitable for storing a first repair address during a first mode;
    a second fuse set unit suitable for storing an second repair address during a second mode; and
    a comparison unit suitable for receiving an active command and an input address from outside when the semiconductor memory device enters the second mode, and comparing the first repair address and the input address,
    wherein the first fuse set unit comprises a reset unit for resetting the first fuse set unit when the first repair address is the same as the input address.

14. The semiconductor memory device of claim 13, wherein the second fuse set unit stores the input address as the second repair address according to a fuse set setting signal which is enabled in response to a write command after the active command is applied.

15. The semiconductor memory device of claim 13, further comprising:
    an address transmission unit suitable for outputting a first fuse set select signal, which is enabled when the first repair address is the same as the input address during the second mode, and a second fuse set select signal, which is enabled during the second mode, and transferring the input address to one or more of the first and second fuse set units; and a path control unit suitable for controlling the address transmission unit for transmission of the first fuse set select signal, the second fuse set select signal, and the input address.

16. The semiconductor memory device of claim 15, wherein the reset unit is driven in response to the first fuse set select signal having a predetermined level.

17. The semiconductor memory device of claim 15, wherein the path control unit comprises:

a first path control section suitable for controlling the address transmission unit to output the enabled first fuse set select signal or transfer the input address to the first fuse set unit in response to the comparison result in response to the active command; and a second path control section suitable for controlling the address transmission unit to output the second fuse set select signal and transfer the input address to the second fuse set unit during the second mode.

18. The semiconductor memory device of claim 17, wherein the address transmission unit comprises:

a select address transmission unit suitable for outputting the first fuse set select signal and second fuse set select signal to the first and second fuse set units, respectively, under the control of the path control unit; and a repair address transmission unit suitable for transferring the input address to one or more of the first and second fuse set units under the control of the path control unit.

19. The semiconductor memory device of claim 18, wherein the repair address transmission unit transfers the input address to the second fuse set unit during the second mode.

20. The semiconductor memory device of claim 13, wherein the first mode comprises a repair operation mode performed before packaging, and the second mode comprises a repair operation mode performed after packaging.

21. An operating method of a semiconductor memory device which includes a first fuse set unit suitable for storing a first repair address during a first mode and a second fuse set unit suitable for storing an input address during a second mode, the operating method comprising:

comparing the input address with the first repair address; and resetting the first fuse set unit when the first repair address is the same as the input address.

22. The operating method of claim 21, further comprising:

outputting a first fuse set select signal, which is enabled when the first repair address is the same as the input address during the second mode, and a second fuse set select signal, which is enabled during the second mode;

transferring the input address to one or more of the first and second fuse set units; and controlling transmission of the first fuse set select signal, the second fuse set select signal, and the input address.

23. The operating method of claim 22, wherein the first fuse set unit is reset in response to the enabled first fuse set select signal.

24. The operating method of claim 22, wherein the controlling of transmission comprises:

outputting the enabled first fuse set select signal or transferring the input address to the first fuse set unit in response to a result of the comparing during the second mode; and outputting the second fuse set select signal and transferring the input address to the second fuse set unit during the second mode.

25. The operating method of claim 21, further comprising transferring the input address to the first fuse set unit when the first repair address is different from the input address.

26. The operating method of claim 21, further comprising activating the second fuse set based on a bank address included in the input address during the second mode.

27. The operating method of claim 26, wherein the activating deactivates the second fuse set when a previous bank address inputted during a previous second mode is the same as a current bank address inputted during a current second mode.

* * * * *